United States Patent
Kaneko et al.

[11] Patent Number: 5,333,289
[45] Date of Patent: Jul. 26, 1994

[54] MAIN MEMORY ADDRESSING SYSTEM

[75] Inventors: Seiji Kaneko, Yokoyama, Japan; Masaya Watanabe, Arlington, Mass.; Toshiyuki Kinoshita, Sagamihara, Japan; Yasuhisa Tamura, Sagamihara, Japan; Masaichiro Yoshioka, Sagamihara, Japan

[73] Assignee: Hitachi, Ltd., Tokyo, Japan

[21] Appl. No.: 703,458

[22] Filed: May 21, 1991

[30] Foreign Application Priority Data

May 25, 1990 [JP] Japan ................... 2-136096

[51] Int. Cl.⁵ .................................. G06F 12/00
[52] U.S. Cl. ..................... 395/400; 364/243; 364/243.1; 364/245; 364/245.2; 364/246; 364/246.4; 364/255.1; 364/255.7
[58] Field of Search ................. 395/400, 425

[56] References Cited

U.S. PATENT DOCUMENTS

| | | | |
|---|---|---|---|
| 3,796,996 | 3/1974 | Curley et al. | 395/425 |
| 4,293,910 | 10/1981 | Flusche et al. | 395/425 |
| 4,740,911 | 4/1988 | Shar et al. | 395/425 |
| 4,754,394 | 6/1988 | Brantley, Jr. et al. | 395/400 |
| 4,980,822 | 12/1990 | Brantley, Jr. et al. | 395/400 |

Primary Examiner—Rebecca L. Rudolph
Attorney, Agent, or Firm—Fay, Sharpe, Beall, Fagan, Minnich, & McKee

[57] ABSTRACT

In a computer system having a main storage equipment comprising a plurality of storage equipments, the storage area of each storage equipment is divided in fixed units and an interleave mode is set for each of fixed nuts. When configuration of the main storage equipment is to be changed by disconnection or coupling of storage equipments, necessary data are moved and the interleave mode is changed for all data of the above described fixed unit.

8 Claims, 12 Drawing Sheets

FIG. 3

| NO | MODE | VALUE OF ABSOLUTE ADDRESS A (BIT A19) | STORAGE CONFIGURATION UNIT NUMBER |
|---|---|---|---|
| 1 | MODE 1 (M0=0, M1=1) | '0' | NO. 1 (MS 0) |
| | | '1' | NO. 2 (MS 1) |
| 2 | MODE 2 (M0=1, M1=0) | '0' | NO. 2 (MS 1) |
| | | '1' | NO. 1 (MS 0) |
| 3 | MODE 3 (M0=0, M1=0) | '0' | NO. 1 (MS 0) |
| | | '1' | NO. 1 (MS 0) |
| 4 | MODE 4 (M0=1, M1=1) | '0' | NO. 2 (MS 1) |
| | | '1' | NO. 2 (MS 1) |

FIG. 7

| NO | MODE | VALUE OF ADDRESS | STORAGE CONFIGURATION UNIT NUMBER |
|---|---|---|---|
| 1 | MODE 1 | '00' | NO.1(MS0) |
| | | '01' | NO.2(MS1) |
| | | '10' | NO.3(MS2) |
| | | '11' | NO.4(MS3) |
| 2 | MODE 2 | '00' | NO.2(MS1) |
| | | '01' | NO.3(MS2) |
| | | '10' | NO.4(MS3) |
| | | '11' | NO.1(MS0) |
| 3 | MODE 3 | '00' | NO.3(MS2) |
| | | '01' | NO.4(MS3) |
| | | '10' | NO.1(MS0) |
| | | '11' | NO.2(MS1) |
| 4 | MODE 4 | '00' | NO.4(MS3) |
| | | '01' | NO.1(MS0) |
| | | '10' | NO.2(MS1) |
| | | '11' | NO.3(MS2) |
| 5 | MODE 5 | '00' | NO.1(MS0) |
| | | '01' | NO.2(MS1) |
| | | '10' | NO.1(MS0) |
| | | '11' | NO.2(MS1) |
| 6 | MODE 6 | '00' | NO.2(MS1) |
| | | '01' | NO.1(MS0) |
| | | '10' | NO.2(MS1) |
| | | '11' | NO.1(MS0) |
| 7 | MODE 7 | '00' | NO.3(MS2) |
| | | '01' | NO.4(MS3) |
| | | '10' | NO.3(MS2) |
| | | '11' | NO.4(MS3) |
| 8 | MODE 8 | '00' | NO.4(MS3) |
| | | '01' | NO.3(MS2) |
| | | '10' | NO.4(MS3) |
| | | '11' | NO.3(MS2) |
| 9 | MODE 9 | '00' | NO.1(MS0) |
| | | '01' | NO.1(MS0) |
| | | '10' | NO.1(MS0) |
| | | '11' | NO.1(MS0) |
| 10 | MODE 10 | '00' | NO.2(MS1) |
| | | '01' | NO.2(MS1) |
| | | '10' | NO.2(MS1) |
| | | '11' | NO.2(MS1) |
| 11 | MODE 11 | '00' | NO.3(MS2) |
| | | '01' | NO.3(MS2) |
| | | '10' | NO.3(MS2) |
| | | '11' | NO.3(MS2) |
| 12 | MODE 12 | '00' | NO.4(MS3) |
| | | '01' | NO.4(MS3) |
| | | '10' | NO.4(MS3) |
| | | '11' | NO.4(MS3) |

MAIN MEMORY ADDRESSING SYSTEM

BACKGROUND OF THE INVENTION

The present invention relates to a technique for controlling the configuration of a main storage in a computer system, and in particular to addressing a system of main storage equipment which is divided into a plurality of storage equipment with the object of increasing the system capacity and distributing the system load.

A first technical problem of system design of main storage equipment in a computer system is how to connect main storage equipment which is lower in speed than arithmetic and logic equipment without degrading the performance of the arithmetic and logic equipment operating at high speed. As one of the techniques for solving that problem, there is a construction method of main storage referred to as main storage interleave.

According to this method, a main memory comprises a combination of multiple storage equipment which can operate independently of each other. By configuring main storage equipment in this way and making storage equipment each operating at low speed operate in parallel, the load borne by each storage equipment can be reduced and the throughput can be increased. As a result, main storage equipment which is equivalently high in speed as a whole can be obtained.

This method is described in Information Processing Handbook, Ohm Sha Ltd., May 1989, p. 260, for example. In an example described therein, n pieces of storage equipment are prepared, and a space of a main storage address (absolute address) which can be accessed from a program is divided into n. Each portion of this space is assigned to each of the storage equipment.

For ensuring the performance by using this interleave method, the absolute address space must be distributed so that the main storage area referred to by arithmetic and logic equipment may be suitable distributed among all of the storage equipment. In dividing the absolute address space, therefore, the area assignment should be chosen so that the area assignment to each storage equipment may become dense in the absolute address space.

That is to say, in order to distribute the main storage area referred to by a program, which runs on processing equipment, among each of the storage equipment, the storage area within each storage equipment is finely divided. In case two storage equipments are used, for example, the main storage area is divided into pieces each having a capacity of 2 KB and these are alternately assigned to the two storage equipments.

An example of this situation is shown in FIG. 9. In this example, the range of 0 to 2 KB of absolute address is assigned to a range of 0 to 2 KB in the area of a storage equipment (1) and the range of 2 to 4 KB of absolute address is assigned to a range of 2 to 4 KB of a storage equipment (2). Remaining portions are used as different areas of absolute address.

A second technical problem in the main storage equipment system technique is to facilitate changing the equipment configuration in a system comprising multiple storage equipment or changing capabilities of respective storage equipment. As a representative technical method with respect to this problem, there is a method using a floating address register (hereinafter referred to as FAR) as described in U.S. Pat. No. 4,280,176.

This method comprises the steps of referring to a table describing the configuration of the main storage with respect to the address (FAR translation table) which entry is provided at a fixed unit. When the main storage is to be referred to, this table is referred to in order to determine if storage equipment is assigned to that address or not, and if assigned, which equipment is assigned to the data required, and referring to the data in the corresponding storage equipment using that information. When a configuration of the storage equipment of the main storage is to be changed, the FAR translation table is to be changed and it is possible to perform manipulation such as disconnection of a part of storage equipment included in the main storage equipment or rearrangement of storage equipment to another area by manipulating the above described table.

In assigning storage equipment to absolute addresses by using the FAR method, the absolute address space must be divided by taking a unit as large as nearly a few MB because there are limitations to the capacity of the FAR translation table. Since this partitioning unit of absolute address space for FAR method is too large, the load supplied from processing equipment is not sufficiently distributed between storage equipment simply by distributing the address area between the storage equipment.

A third technical problem relating to the configuration of the main storage equipment is one relating to dynamic re-configuration of storage equipment. That is to say, it is desired to have a technique for disconnecting a part of storage equipment included in the main storage while continuing the system operation. This technique is for disconnecting storage equipment in which a defect has occurred or to perform maintenance service with respect to storage equipment. This is one of the problems in attaining non-stop continuous operation of a computer system. This concept regarding this technique are described in JP-A-58-88900.

Assuming that an area on an address space being used at the present time is located on storage equipment to be disconnected from this time forth. The above described prior technique discloses a procedure for moving that area onto a remaining storage equipment to continue the processing (hereafter referred to as dynamic re-configuration processing).

That is to say, (1) From the area on the address space being used at the present time, a portion which must be left on the storage equipment to continue the processing in the system is extracted.

(2) Portions other than the portion extracted in (1) are saved into an external storage equipment whereby a void area having the same capacity as the portion extracted in (1) is made on the storage equipment which will remain in use.

(3) That indispensable area on the storage equipment to be disconnected is copied onto the void area on the storage equipment secured in the processing of (2) on the equipment which will continue to be used.

(4) The FAR table is changed. Storage equipment corresponding to the absolute address of the indispensable area is reassigned from the storage equipment to be disconnected before a copy operation, to the area of the storage equipment to be continuously used and which is also the destination of the copy operation.

In the storage equipment using both the above described FAR method and interleave method, the main storage configuration can be flexibly changed owing to the FAR table and the load can be distributed owing to interleave. Arrangements between the absolute address and a storage equipment are determined through a translation process consisting of two steps, i.e., translation by using the FAR table and interleave, however, addressing on the storage equipment becomes complicated. In an ordinary program using only the absolute address, it is not necessary to be conscious of this addressing complication. In the case of dynamic re-configuration of the main storage, however, two problems as described below are posed.

A first problem will now be described. In the case of dynamic reconfiguration, processing must be performed with attention to the assignment of data on storage equipment and determining which storage equipment contains an area indispensable to the system according to this data addressing. The complication in addressing results in dynamic re-configuration processing becoming complicated.

A second problem is that the number of storage equipment included in the main storage is specified by a mode that specifies the processing method of interleave and hence addressing between the absolute address and storage equipment is lost in the entire address space when the mode is switched. When the configuration of storage equipment is changed, therefore, the access of the main storage must be stopped, resulting in a problem. This problem will now be described by referring to an example described below.

It is now assumed that a system has two storage equipments and either alternative use of two storage equipments every 4 KB with interleave using address after FAR translation or use of only one storage equipment without performing interleave can be selected by a one-bit mode. Processing performed to change the configuration so as to disconnect one storage equipment from the above described system configuration and use only one remaining storage equipment will now be considered.

The moment the above described mode is so changed over that one storage equipment may be sued in this case, all correspondence relations between absolute addresses and data on the storage equipment are lost and hence the main storage data cannot be accessed correctly by the absolute address until relations between absolute addresses and the storage equipment is recovered. Therefore from the time the mode is changed over all accesses from other equipment which uses the indispensable area to the main storage must be suppressed.

For recovering this addressing, however, all of the data having half quantity of the indispensable area on the storage equipment must be copied to the storage equipment to the equipment which will continue to be used. As a result, a large quantity of data must be transferred. Depending upon the capacity of the main storage, the time required for processing extends over several hundred milliseconds to several seconds. This is a long period of suspension which cannot be permitted even in a general input/output equipment such as disk equipment or communication control equipment. This causes a problem of aggravated response in a process control system, an online control system or the like requested to work in real-time operation.

SUMMARY OF THE INVENTION

An object of the present invention is to provide a technique facilitating the realization of configuration control of main storage.

Another object of the present invention is to provide a technique capable of preventing response aggravation in a process control system, an online control system or the like requested to work in real-time operation.

Still another object of the present invention is to provide a technique capable of shortening the period of data transfer processing of the entire main storage and shortening the period of suspension of the main storage.

Yet another object of the present invention is to provide a technique capable of setting one interleave mode with respect to the entire main storage area and setting a different mode with respect to each of areas obtained by dividing the main storage into sections.

A further object of the present invention is to provide such a main storage reconfiguration method that the quantity of processing may be minimized irrespective of the state of interleave.

In order to achieve the above described objects, a computer system having a main storage constituted by multiple storage equipment capable of operating in parallel comprises a mechanism, responsive to an interleave mode so set as to correspond to an absolute address and a predetermined bit contained in the above described absolute address, to select a main storage equipment assigned to that absolute address.

The above described interleave mode is stored in an interleave table referred with several high-order bits of the above described absolute address.

One entry of the above described interleave table comprises an address which points to a location within a storage equipment and a predetermined bit for setting an interleave mode.

By the above described predetermined bit within the above described absolute address, the unit of interleave is defined.

Thus, the above described interleave mode can be set for each unit of controlling the main storage configuration.

A storage configuration unit number is generated by applying logical operation to the interleave mode so set as to correspond to the above described absolute address and the predetermined bit in the absolute address described above.

A storage equipment specified by the calculation described above is then accessed by the address obtained by concatenation of the address within the storage equipment and the low-order address of the absolute address.

When the number of the storage equipment of which the main storage consists is $2^n$ (where n is such an integer that n−1), the number of kinds of the above described interleave modes is $2^n \times (n+1)$.

The mode of the above described interleave is stored into a rewritable interleave table, and address translation is performed between an absolute address used by the program and a physical address of storage equipment by using the above described interleave table. Further, when the main storage is to be re-configured by disconnecting a part of the main storages, the main storage re-configuration is performed by moving contents stored in a storage equipment to be disconnected onto a storage equipment which is not disconnected, and rewriting the FAR table so that the unchanged absolute address can be used by the program in spite of the change of the physical storage location caused by the contents transfer above, and rewriting the interleave mode of the FAR table according to the new assignments between absolute address and storage equipments after the contents transfer mentioned above.

The above described processing of moving storage contents comprises a processing of moving an area whose contents must be preserved after re-configuration to an area whose contents need not be preserved.

In case storage equipment corresponding to the absolute address include both the above described storage equipment to be disconnected and storage equipment which is not to be disconnected, the above described processing of changing the interleave mode comprises the processing of changing interleave modes of respective storage equipment to the interleave mode possessed by the storage equipment which is not disconnected.

Instead of setting one interleave mode with respect to the entire main storage area, respective interleave modes can be set for respective areas obtained by dividing the main storage into sections. Thereby, a period of suppression of access to the main storage required for recovering of addressing to the above described main storage is shortened. In a preferred embodiment of the present invention, it is made possible to perform storage configuration processing of every FAR-addressed storage unit by making it possible to set an interleave mode for every FAR-addressed storage unit. By such a configuration, it becomes possible to predetermined whether interleave is performed for each FAR-addressed storage unit. When the interleave state is changed to the non-interleave state for one FAR-addressed storage unit, there occurs no change in correspondence relation between the absolute address other than the subject FAR-addressed storage unit and the main storage equipment. In accordance with the present invention, therefore, main storage re-configuration processing performed during execution of interleave which poses a problem in the prior art is conducted as described below. That is to say, the present invention makes it possible to conduct the above described processing for every unit whereby the state of interleave can be changed. Therefore, the unit of suppression of reference to the main storage may be a FAR-addressed storage unit. Reference to and update of the main storage other than the FAR-addressed storage unit which becomes the subject of re-configuration can be continuously conducted. Further, by setting the FAR-addressed storage unit at a sufficiently small value, a period of suppression for the FAR-addressed storage unit which becomes the subject of re-configuration also becomes short. In this case, a period required for processing ranging from the interleave mode change to recovery of main storage addressing is only a period required for transfer of data having a quantity nearly equivalent to that of a FAR-addressed storage unit. As a result, the quantity of processing becomes approximately 1/10 to 1/1000 as compared with the data transfer processing of the entire main storage needed by the prior art. The period of suspension of access to the main storage is also shortened in proportion thereto.

BRIEF DESCRIPTION OF THE DRAWINGS

FIG. 3 is a diagram of interleave mode which is an embodiment of the present invention;

FIG. 7 is a diagram showing the interleave modes in the configuration of FIG. 6;

DESCRIPTION OF THE PREFERRED EMBODIMENTS

An embodiment of the present invention will be hereafter described concretely by referring to drawings.

Figure 2:
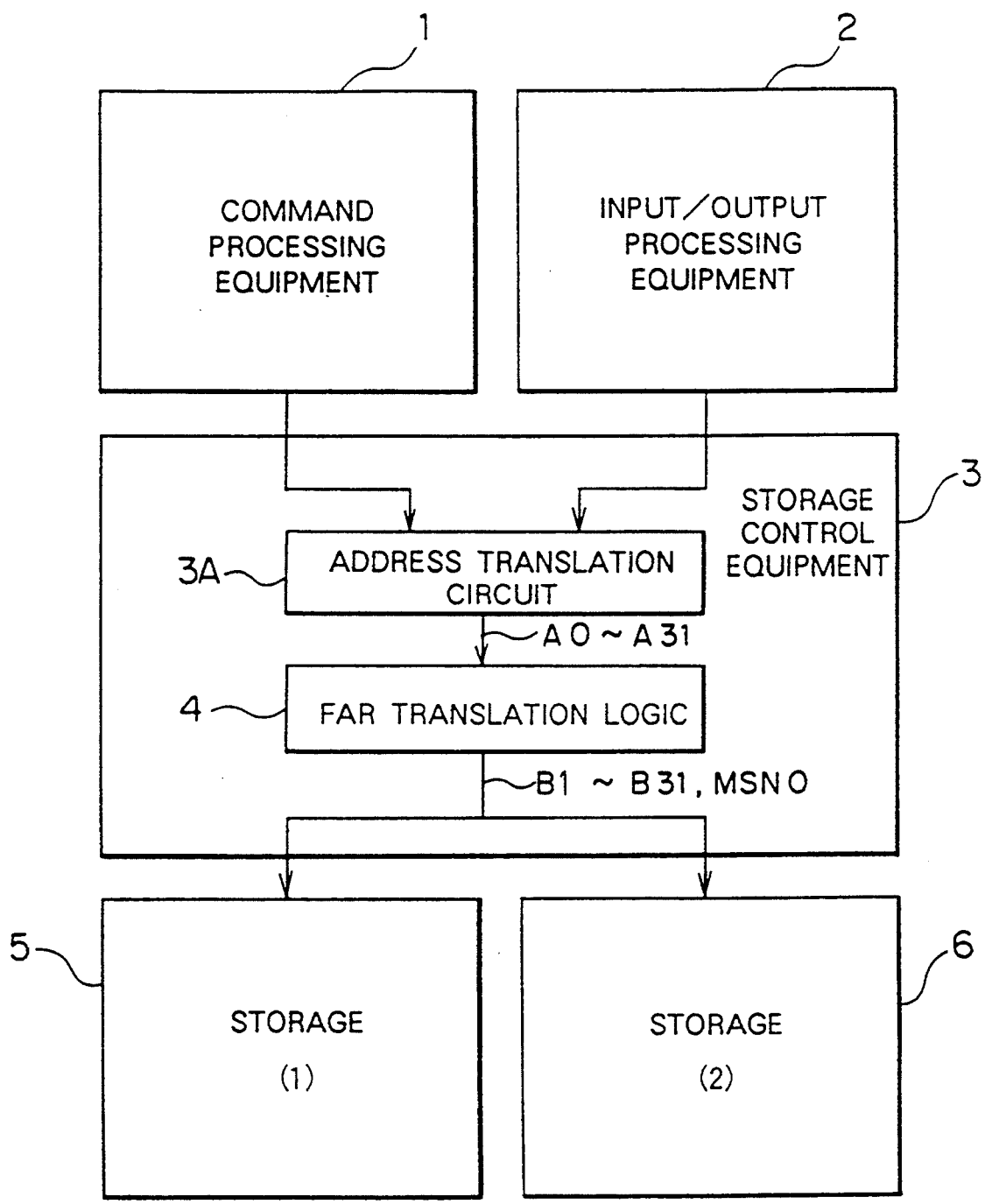
FIG. 2 is a system configuration diagram according to the present invention.

FIG. 2 is a configuration diagram of a computer system having two storage equipments according to the present invention. The system shown in FIG. 2 comprises a command processing equipment 1, an input/output processing equipment 2, a storage control equipment 3, an address translation circuit 3A, an FAR translation logic 4, and storage equipments 5 and 6.

As shown in FIG. 2, the FAR translation logic 4 converts an absolute address A specified by a program working on the instruction processing equipment 1 or by the input/output processing equipment 2 to a storage configuration number MSNO of the storage equipments 5 and 6 corresponding to that address A and an address B within storage equipment.

In the following description, suffixes 0 to 31 are used as location name indicating a position within an address. That is to say, A2 indicates the second bit of an absolute address A, and B23 indicates the 23-rd bit of an absolute address B. Further, the highest-order bits of the absolute addresses A and B are referred to as zeroth bits.

There are two storage equipments 5 and 6 each having a maximum capacity of 2 GB. Therefore, the address B sent to the storage equipments 5 and 6 needs 31 bits represented as B1 to B31 in order to make up to 2 GB addressable.

Further, it is discriminated on the basis of a storage configuration unit number MSNO, occupying one bit, that indicates which of the two storage equipments 5 and 6 is being used. That is to say, the above described translation is used to derive a 31-bit intra-storage-equipment address B and a one-bit storage equipment number from the 32-bit absolute address A.

The translation heretofore described is performed as follows.

(1) 24 lower part bits of the absolute address A, i.e., bits A8 to A31 are used as 24 bits B8 to B31 of the intra-storage-equipment address B as they are.

(2) On the basis of 8 bits A0 to A7 of the absolute address A, an FAR translation table 20 (FIG. 1) is retrieved and FAR translation is performed to derive 7 highorder bits (hereafter represented as B1 to B7) of the intra-storage-equipment B. At the same time, two interleave mode bits (M0, M1) for that FAR-addressed storage unit are derived.

(3) On the basis of bit A19 included in 24-bit data (A8 to A31) of the absolute address A and the interleave mode bits M0 and M1, a storage configuration unit number MSNO is derived.

Figure 1:
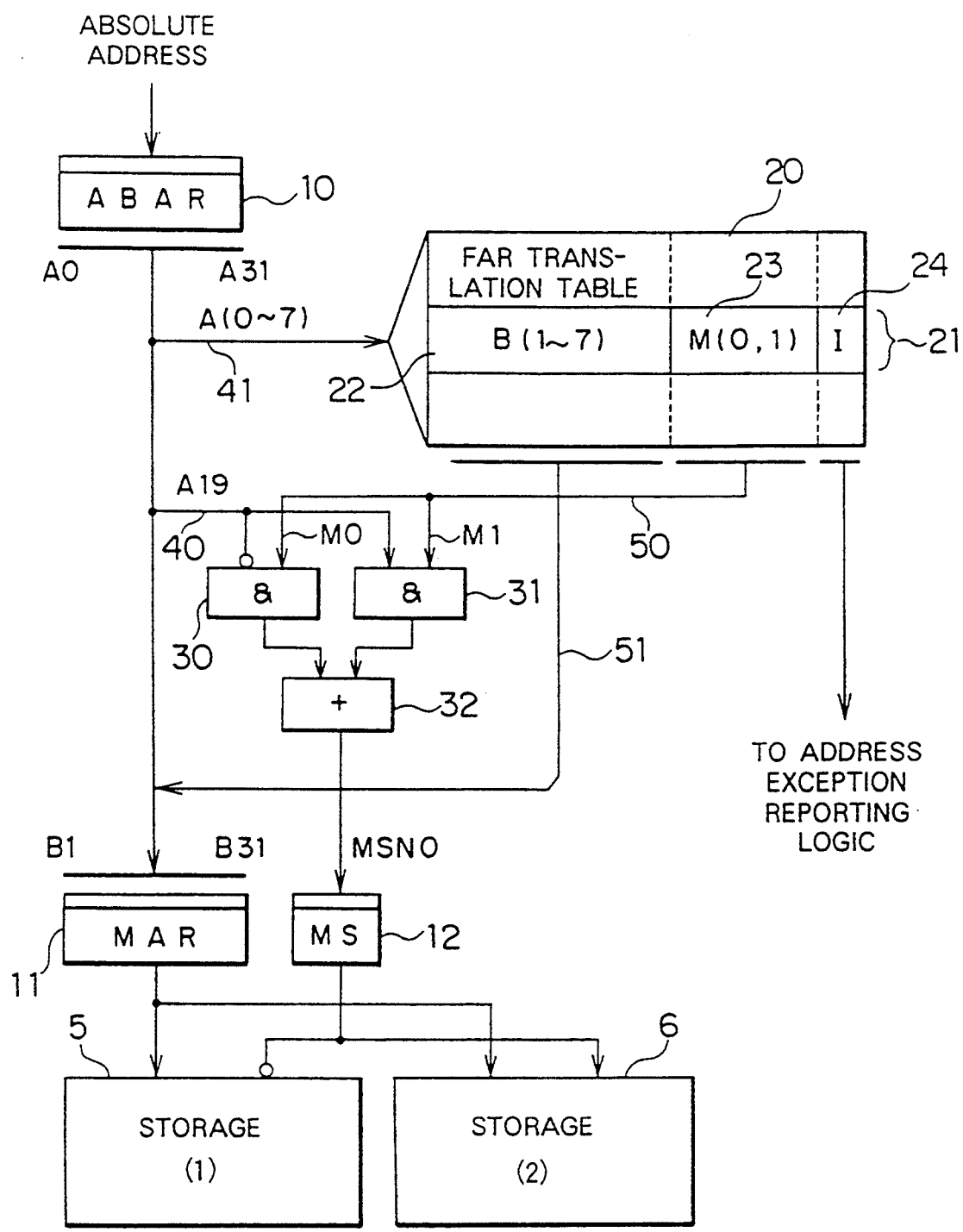
FIG. 1 is a detailed diagram of FAR translation processing which is an embodiment of the present invention.

The FAR translation logic 4 will hereafter be described in more detail by referring to FIG. 1.

With reference to FIGS. 1 and 2, an absolute address register (ABAR) 10 is a register for setting therein an absolute address inputted from the command processing equipment 1 or the input-output processing equipment 2 (i.e., an address translated by the address translation circuit 3A). Address A0-A7 represented by bits 0 to 7 of the above described absolute address register 10 is inputted to the FAR translation table 20 via a line 41. As a result, 256 FAR entries (FAR-addressed storage units) 21 are set with respect to 4 GB.

One entry 21 of the FAR translation table 20 comprises three fields, where are, a field 22 that holds the rest of intra-storage-equipment address (B1 to B7) represented as 7-bit data, a field 23 of interleave mode bit (M0, M1) occupying two bits, and a field 24 of entry invalid bit (I) occupying one bit. Thus one entry 21 comprises 10 bits in total.

As for the intra-storage-equipment address 22 (address B), address B1 to B7 on a line 51 outputted by the FAR translation table 20 is merged with the remaining portion B8 to B31 of the absolute address set in the absolute address register 10. An address comprising the bits B1 to B31 is thus generated and is set into a memory address register (MAR register) 11.

On the basis of the interleave mode bits 23 outputted from the FAR entry 21 of the FAR translation table 20, which are, M0 and M1 on a line 50, and bit A19 via a line 40 of FIG. 1 by the absolute address register 10, a storage configuration unit number MSNO is generated by a combinational logic circuit comprising AND gates 30 and 31 as well as an OR gate 32, and is set into a memory select register (MS) 12.

The intra-storage-equipment address B and the storage configuration unit number MSNO thus generated are used when the storage equipments 5 and 6 are referred to.

FIG. 3 shows correspondence relations among interleave mode, the value of bit A19 of the absolute address, and storage configuration unit number.

That is to say, the mode bits as M0="0" and M1="1" in case of mode 1. Therefore, the AND gate 30 supplied with M0 always outputs "0", and the AND gate 31 supplied with M1 outputs the value of bit A19 of the absolute address as it is. Therefore, the output of the OR gate 32 which is the logical sum of outputs of these two gates coincides with the value of bit A19 of the absolute address register 10. That is to say, MS0 is used if the bit A19 of the absolute address register 10 is "0", whereas MS1 is used if the bit A19 is "1".

On the other hand, both the mode bits M0 and M1 are "0" in mode 3. Therefore, both the AND gate 30 and the AND gate 31 always output "0", and the OR gate always outputs "0". As a result, only the storage configuration unit number MSNO is used irrespective of the value of bit A19 of the absolute address register 10. The above explanation of operation is also applicable for modes 2 and 4 as well.

Although not related to the interleave operation, the present invention prepares one bit, which is the entry invalid bit (I) 24 indicating that the FAR-addressed storage unit is invalid, as the output of the FAR translation table 20. When the bit is "1" as a result of FAR translation this means that the FAR-addressed storage unit is invalid, and that fact is reported to the program which has referred to or updated that area via a reporting logic (for example, by interrupt). At the time of dynamic re-configuration of main storage, this one bit is used to prevent references to a storage equipment corresponding to a certain FAR entry from the processing equipment.

FIGS. 4a to 4d show data storage states in respective interleave modes shown in FIG. 3. In case the mode 1 or mode 2 is used in a system having two storage equipments, arrangement on the main storage equipment for one FAR-addressed storage unit changes as follows. That is to say, whenever the address bit A19 is inverted, the value which can be assumed by the storage configuration unit number MSNO alternates between "0" and "1". For one FAR-addressed storage unit, however, 7 high-order bits of the intra-storage-equipment address B, i.e., B1 to B7 do not change. As shown in FIGS. 4a to 4d, therefore, the area of two storage equipments having a coincident intra-storage-equipment address B and having a capacity of 32 MB in total occupies spaces alternatively between the two storage equipments every 4 KB.

Figure 4A:
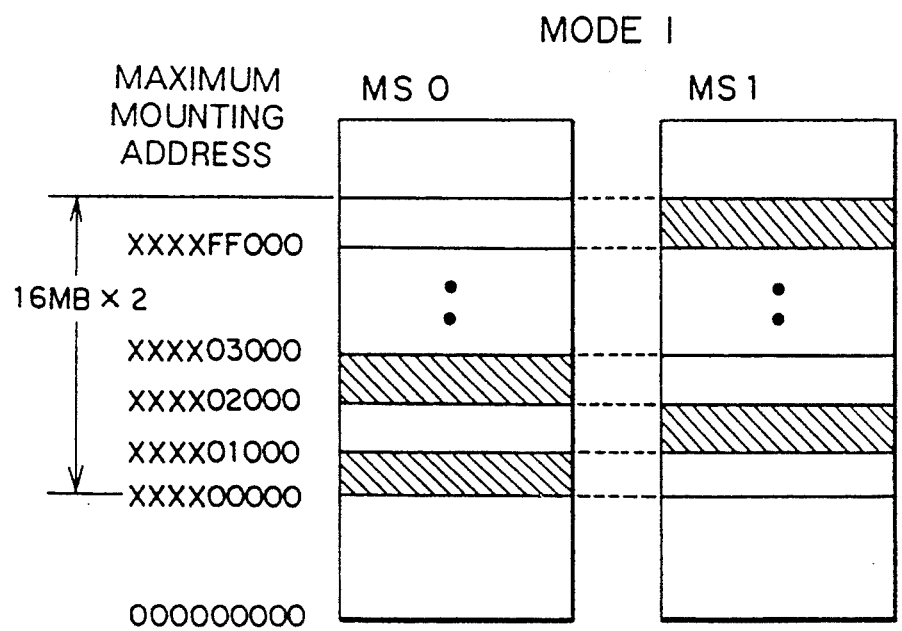
FIG. 4a to 4d are diagrams of the interleave mode of FIG. 3.
Figure 4B:
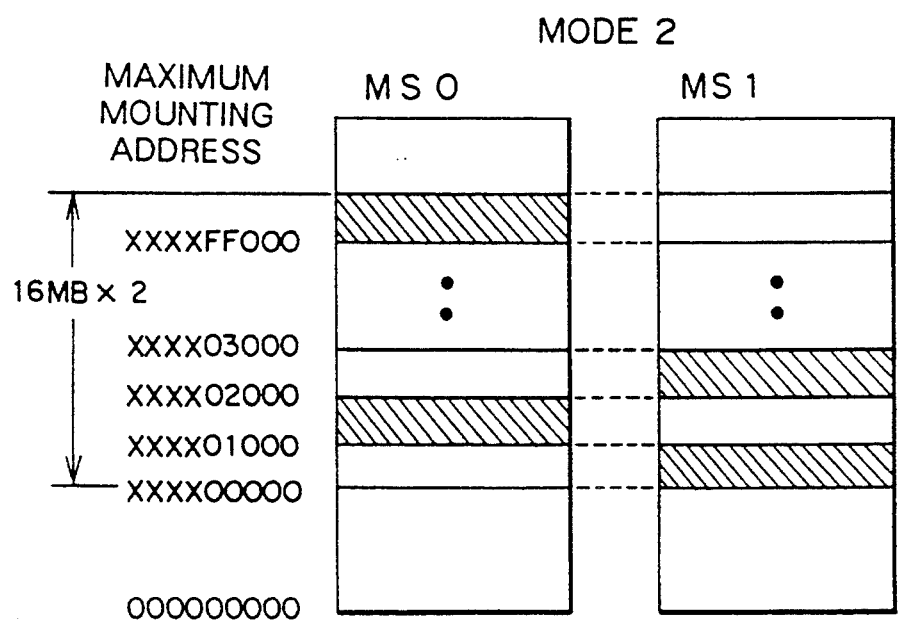
Figure 4C:
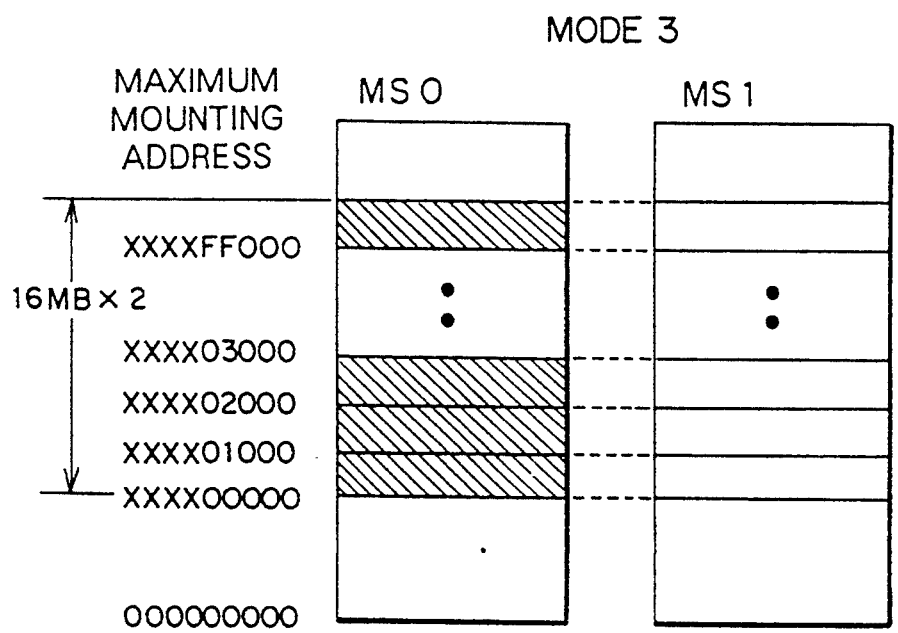
Figure 4D:
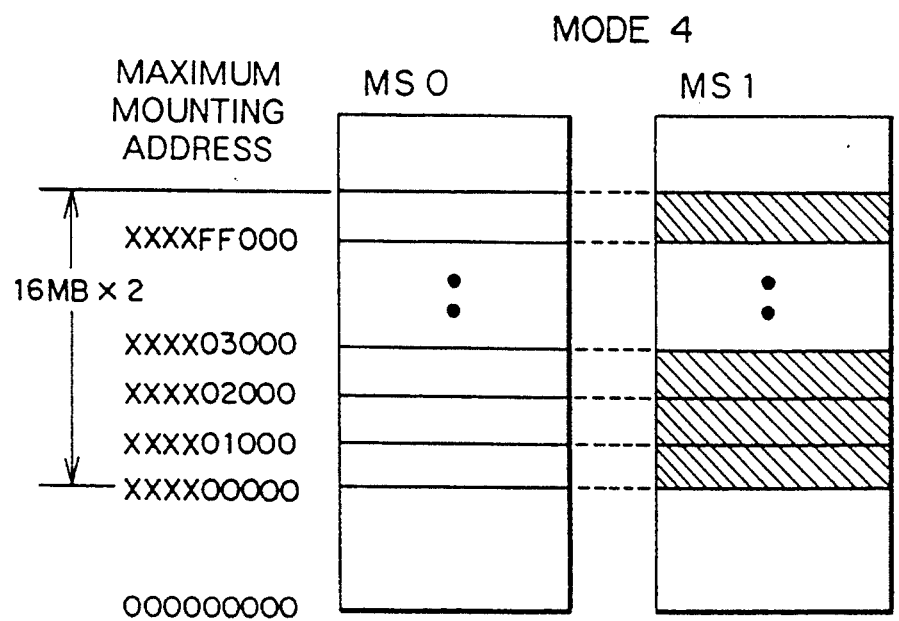

With respect to the lowest-order 4 KB of the absolute address A corresponding to a certain FAR-addressed storage unit of 16 MB, it is now assumed that the interleave mode specified for that FAR-addressed storage unit is mode 1, for example. In that case, the value of bit A19 of the absolute address is "0". From FIG. 3, therefore, it is understood that the storage equipment corresponding to that address is storage equipment 1. That is to say, a 4 KB-area of storage equipment MS0 shown in FIG. 4a is used. If the present mode is mode 2, a 4 KB area of MS1 is used when the value of bit A19 is "0".

Figure 5:
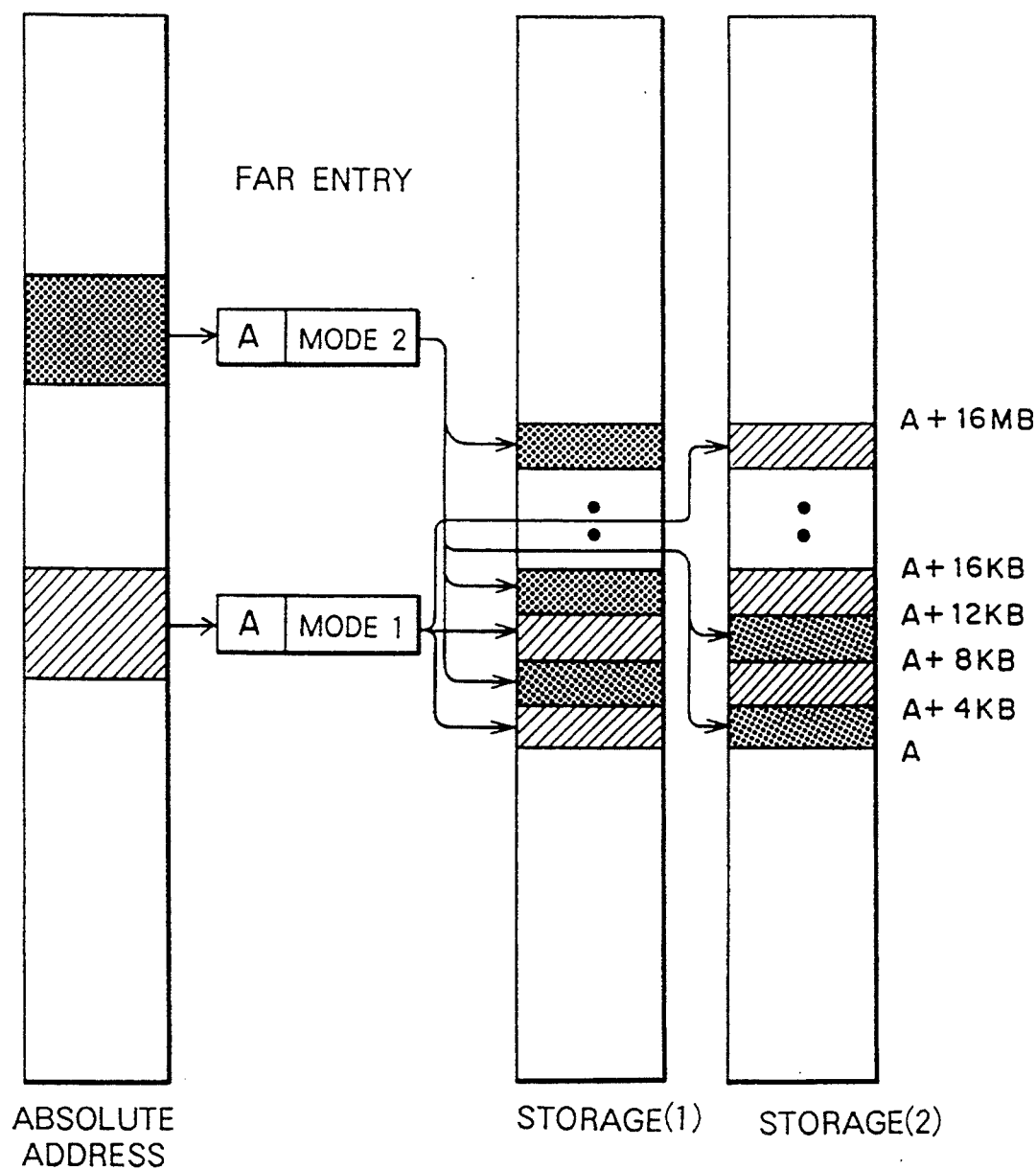
FIG. 5 is a schematic diagram showing the configuration of the use situation of a main storage equipment which is an embodiment configured by using the interleave mode of the present invention.

If at this time two FAR-addressed storage units are paired, mode 1 and mode 2 are respectively assigned to one and the other of them, and the same intra-storage-equipment address 22 (address B) as respective FAR-addressed storage units are specified, these two FAR-addressed storage units are specified, these two FAR-addressed storage units are so arranged on the main storage equipment as to complement unused areas of each other. The area having the size of 32 MB can be used without leaving a space. This situation is shown in FIG. 5.

If both storage equipments are valid for the intra-storage-equipment address B, two FAR-addressed storage units are preferably combined and arranged in this way. In case capacities of storage equipments are not the same or some defects are present within one of the storage equipments, arrangement can be so made as to use only one of the storage equipments by using either mode 3 or mode 4 appropriately in making the arrangement.

In the present embodiment, the unit of interleave has become 4 KB because of A19 is used as the bit for selecting the interleave unit of absolute address. By changing the position of a bit of the absolute address A used in the signal line 40 of FIG. 1, however, the interleave unit can be set at an arbitrary value equivalent to the power of two.

Further, in case the interleave unit is so defined as to have a smaller value, the effect of interleave is improved but the main storage equipment rearrangement processing procedure using commands and software at the same time of disconnection of the main storage equipment becomes complicated. When a larger unit is specified, the above described merit and demerit are reversed.

The FAR setting in this embodiment has heretofore been described. The main storage re-configuration method in this embodiment will hereafter be described. Outline of the main storage re-configuration method has been described in "Background of the Invention". Detailed procedure of the main storage re-configuration method will hereafter be described.

(1) From the storage are which is being used at the present time, a portion which must be left on the main storage equipment to continue operation of the system is extracted. This is the same procedure as the prior art.

(2) Portions other than the portion extracted in (1) are saved into an external storage equipment. A void area having a capacity not less than that of the area extracted in (1) is secured on the storage equipment which remains in use. This step is also identical with the step of the prior art.

(3) An indispensable area on the storage equipment to be disconnected is copied onto the void area on the storage equipment secured in the processing of (2) to be continuously used. This processing will be described later.

(4) Bit I contained in the value of the FAR pointing the storage equipment to be disconnected is changed to "1". When it is requested to refer to or update the main storage to be disconnected, therefore, address specification exception interruption is reported to the software.

The above described procedure of (3) will hereafter be described in detail. First of all, copy procedure of the main storage in the present embodiment will now be described.

Main storage copy: Data of the FAR-addressed storage unit is copied from the source area of copy operation to the destination area of copy operation by the procedure described below. It is assumed before this processing that the destination area of copy operation is not currently used. That is to say, it is guaranteed by control program that the destination area of copy operation is not referred to or updated by another processing equipment.

(1) Other equipments are inhibited from referring to or updating an area indicated by the FAR of the source of copy operation. As a result, only the processing equipment performing the re-configuration processing is allowed to refer to or update the source area of copy operation (lock state). A request to refer to or update the source area of copy operation made by another processing equipment is kept waiting until the above described lock is canceled.

(2) Data from the source area of copy operation are copied into the destination area of copy operation. The addresses used at this time are absolute addresses each indicating the destination area and source area of copy operation on the storage equipment. This copy processing is the same processing as data processing performed in a normal program. This copy operation must be able to perform copy operation appropriately even the copy is onto itself.

(3) The FAR is so changed that the absolute address indicating the source area of copy operation may become an absolute address indicating the destination area of copy operation.

(4) Inhibiting (lock) other processing equipments from accessing the source area of copy operation is canceled.

By the processing heretofore described, data are moved from the source area of copy operation on the main storage to the destination area of copy operation on the main storage. The position of data pointed by the absolute address of the source of copy operation undergoes a change in consequence of the copy operation, but contents of data remain unchanged.

At this time, software processing is not affected by the interleave mode of either source area or destination of the copy operation. Even in a case where the destination of a copy operation has an interleave mode different from that of the source of copy operation, copy processing is implemented in accordance with the absolute address and hence it is not necessary for software at the time of data copy operation to be conscious of a difference in interleave mode.

Details of copy procedure of main storage will hereafter be described using the process of 'Main Storage Copy' heretofore described. The following is an example of the procedure. In systems having such interleave modes, the procedure for re-configuring the main storage varies depending upon contents with stress laid thereon at the time of re-configuration such as time required for re-configuration. In the procedure hereafter described, complications are added to the simplicity of software processing.

For the purpose of description, areas having the same intra-storage-equipment address 22 (address B) and different storage configuration unit numbers MSNO's are hereafter referred to as main storage pair collectively. Since it is supposed that this embodiment has two storage equipments, the main storage pair for one FAR-addressed storage unit has a capacity of two FAR-addressed storage units. As such a main storage pair, two combinations described below can be considered.

(1) In case respective FAR's are interleaved, FAR-addressed storage units having interleave modes 1 and 2 are combined.

(2) In case respective FAR's are not interleaved, FAR-addressed storage units having interleave modes 3 and 4 are combined.

In making re-configuration of main storage in combination of FAR-addressed storage units which are not interleaved as described above in 2, an FAR-addressed storage unit located on the storage equipment to be disconnected is moved onto another remaining storage equipment by using the above described main storage copy means without considering the main storage pair. When both data contained in respective FAR-addressed storage units of interleaved main storage pair as described above in 1 are unnecessary for continuation of operation (hereafter simply referred to as void), the FAR can be changed into the non-interleave state by simply changing the interleave mode of the FAR and a void FAR-addressed storage unit can be obtained which does not use the main storage equipment to be disconnected. From the foregoing, processing depending upon the interleave mode is needed when the data of at least one FAR-addressed storage unit is indispensable for the main storage pair interleaved as described above in 1.

In this case, however, main storage re-configuration can be realized by selecting one out of some non-interleaved main storage pairs described above and executing the above described main storage copy processing for moving contents of a storage equipment to be used in the remaining storage area of that pair. Since the capacity of data which must be moved is not much more than the FAR-addressed storage unit at most, the main storage re-configuration can be so realized that processing for certain area may not affect the operation toward other areas.

If there is imbalance in storage equipment size, there are non-interleaved FAR-addressed storage units as much as the difference in the storage equipment having a larger capacity. The processing for that difference becomes identical with the processing for the non-interleaved area.

A method for applying the present invention to four or more storage equipments will now be described. In this case, there is not an essential difference in logical configuration of FAR translation logic as compared with the above described embodiment having two storage equipments. It is thus necessary to alter only the number of bits required for discrimination of interleave mode, the number of bits of the absolute address register used for interleave, combinational logic for interleave generation, and main storage equipment addressing method at that time. As for interleave mode setting, therefore, only the way of thinking and the combination method after alteration will now be described.

Basically, the present invention can be applied to an arbitrary number of storage equipments. Especially in case the number of storage equipments are a power of two, the interleave mode can be set in a relatively systematical way.

Figure 6:
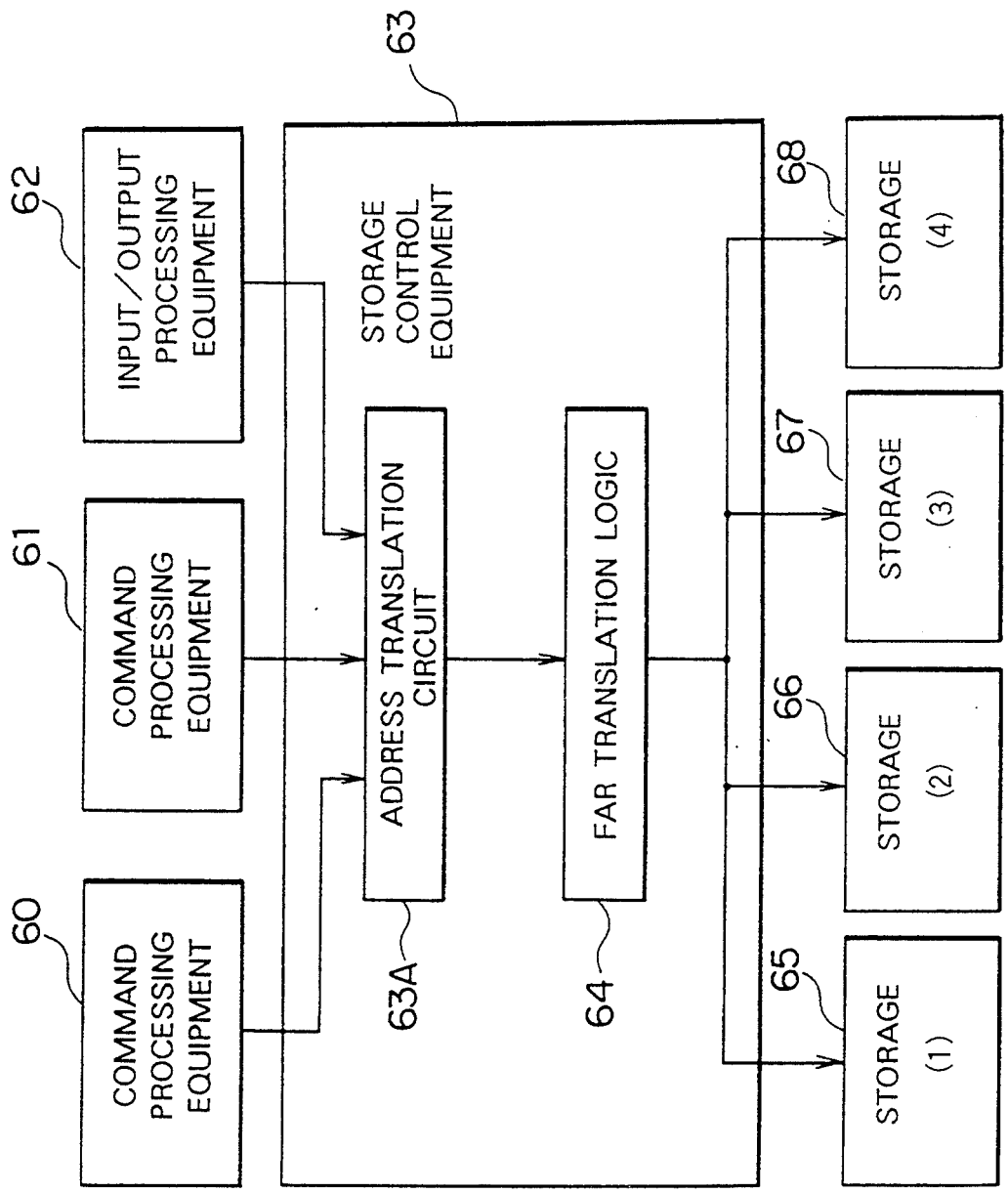
FIG. 6 is another system configuration diagram according to the present invention.

FIG. 6 shows the configuration of a computer system having four storage equipments. The illustrated computer system comprises command processing equipments 60 and 61, and input/output processing equipment 62, a storage control equipment 63, an address translation circuit 63A, an FAR translation logic 64, and storage equipments 65 and 68.

By combining two bits which are not used for retrieving the FAR translation table such as bits A19 and A20 as address bits, four storage equipments 65 to 68 are so configured that interleave of arbitrary patterns may be performed respectively. Therefore, 8(=4×2)-bit data are needed per FAR-addressed storage unit.

However, it is not so important to realize an arbitrary main storage arrangement form. Preferably, if a combination of interleave modes can be realized so that an arbitrary storage equipment may be disconnected and all of remaining storage equipments may be utilized, it will suffice. By eliminating interleave modes having low possibility of use, the above described object can be realized with 12 interleave modes.

Figure 8A:
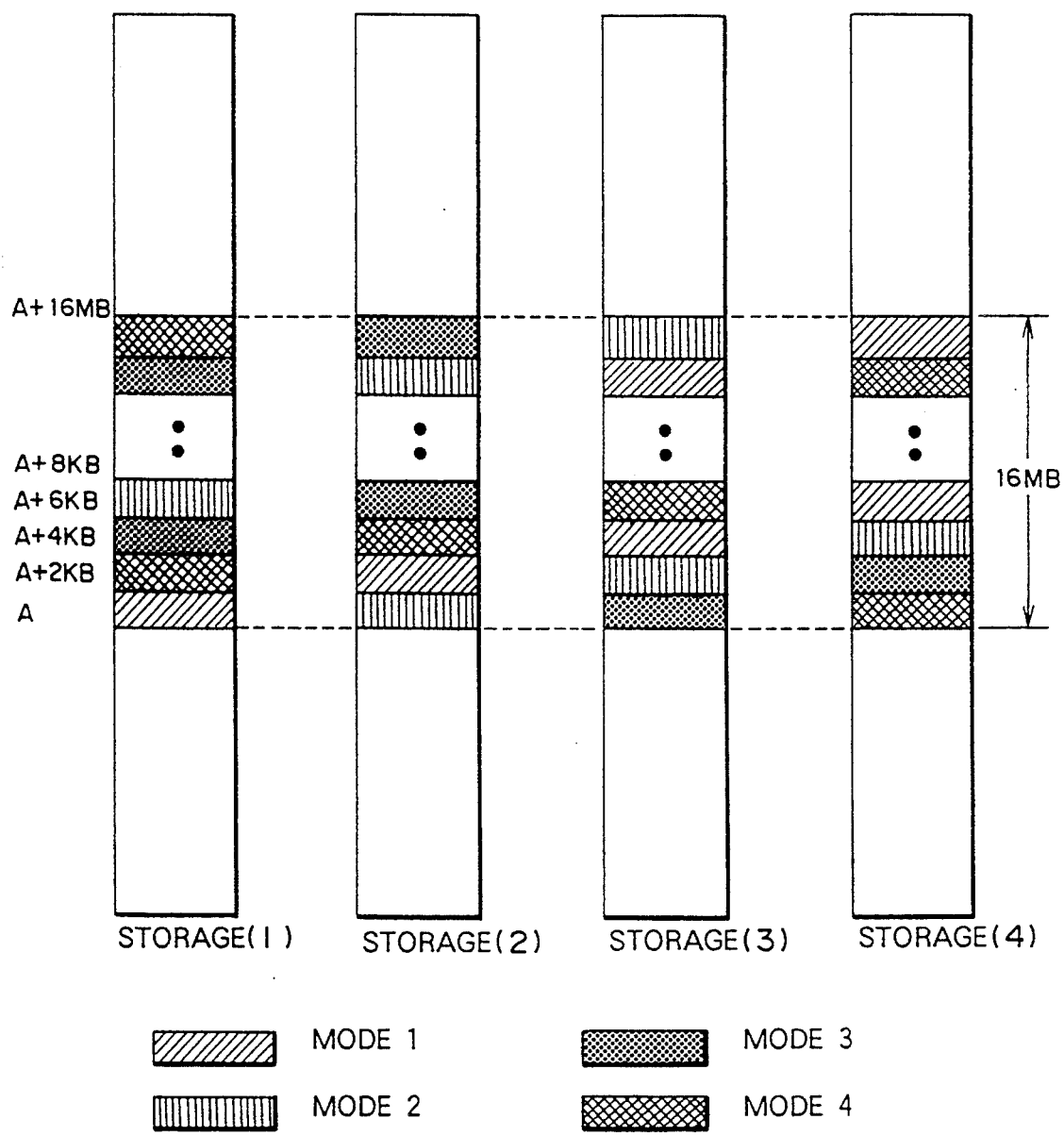
FIGS. 8a to 8c are diagrams of interleave modes of FIG. 7.
Figure 8B:
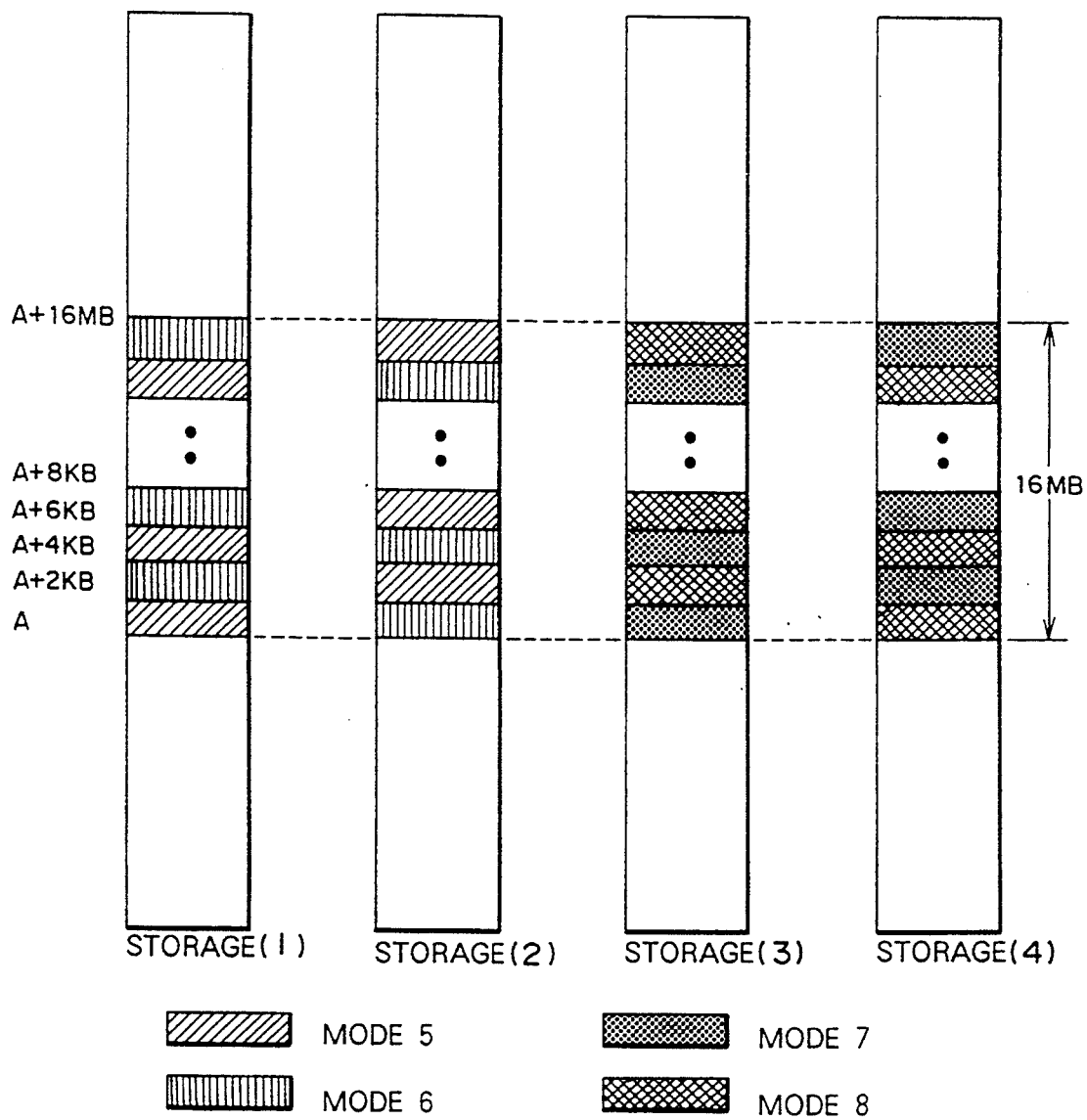
Figure 8C:
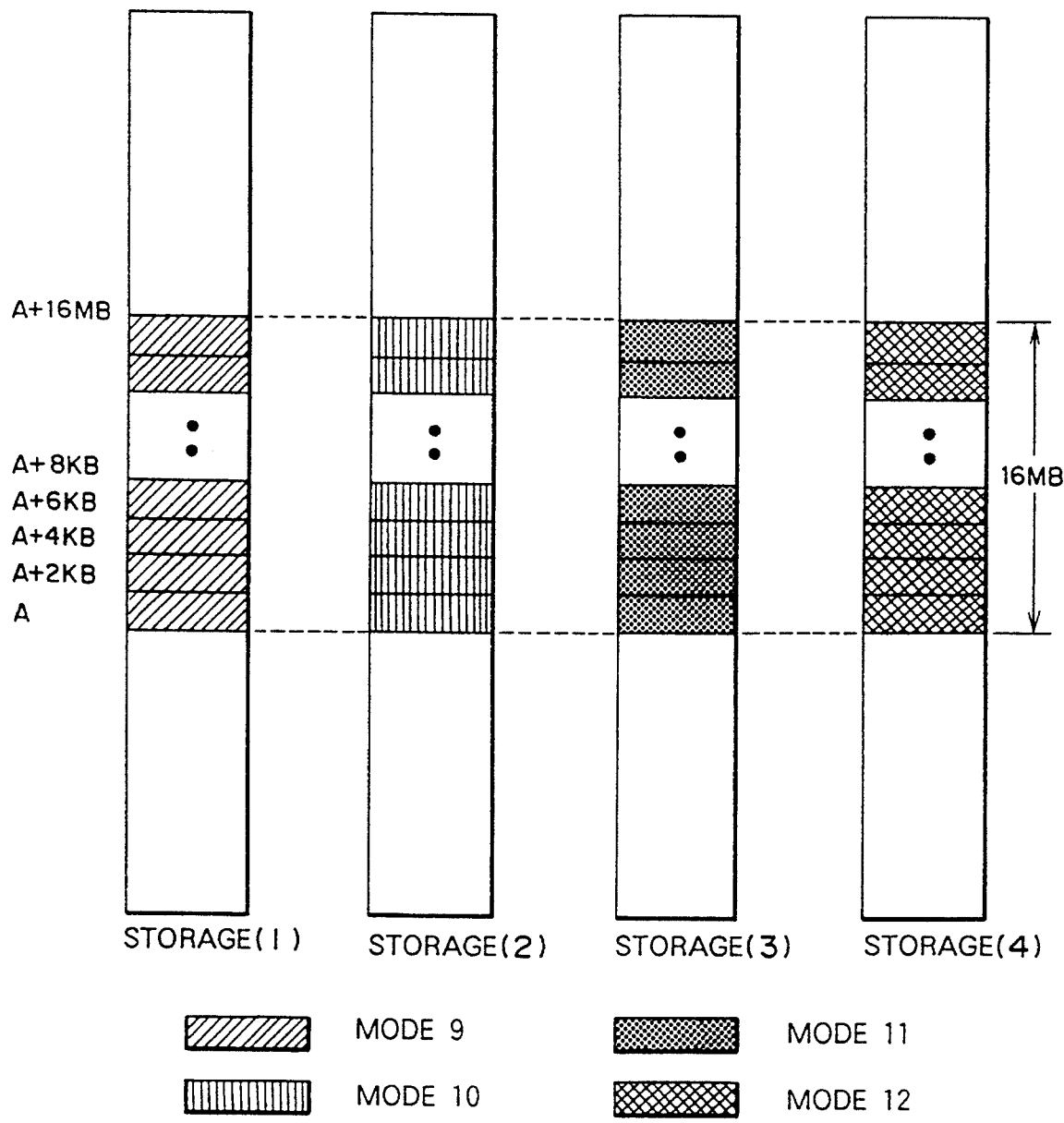

The mode configuration at that time is shown in FIG. 7. Modes 1 and 4 are modes for assigning data to four storage equipments. In the modes 1 to 4, start address of data assigned to respective storage equipment is changed cyclically. Modes 5 to 8 are modes for assigning data to two storage equipments. In the modes 5 to 8, storage equipments to be combined are defined as storage equipments 1 and 2 and storage equipments 3 and 4, and the start address of data to be assigned is changed alternately in respective combinations. Modes 9 to 12 are modes for assigning data to one storage equipment, respectively. How interleave is performed on the main storage equipment in respective modes is shown in FIGS. 8a to 8c. FIG. 8a shows data arrangement in modes 1 to 4 wherein data are assigned to four storage equipments. FIG. 8b shows data arrangement in modes 5 to 8 wherein data are assigned to two storage equipments (1 and 2, and 3 and 4), respectively. FIG. 8c shows data arrangement at the time when data corresponding to respective different modes are assigned to four storage equipments. In this mode, interleave can be performed among four storage equipments or between two storage equipments. For example, in a system having three storage equipments, the system may comprise two interleaved storage equipments and one non-interleave storage equipment. That is to say, when one storage equipment is to be disconnected out of four storage equipments, the disconnection can be made as follows. The FAR-addressed storage unit interleaved by four storage equipments is adapted to comprise an area interleaved by two storage equipments and two areas respectively, implemented by single storage equipments. One of the latter two areas is placed on the storage equipment to be disconnected. Data arrangement is altered by means of copy and movement operations. Thereafter, data on the storage equipment to be disconnected are moved onto suitable locations of three remaining storage equipments, and one storage equipment is disconnected. When data arrangement for one FAR-addressed storage unit is to be altered by reason of a storage equipment defect, for example, processing similar to the above described processing may be conducted.

Figure 9:
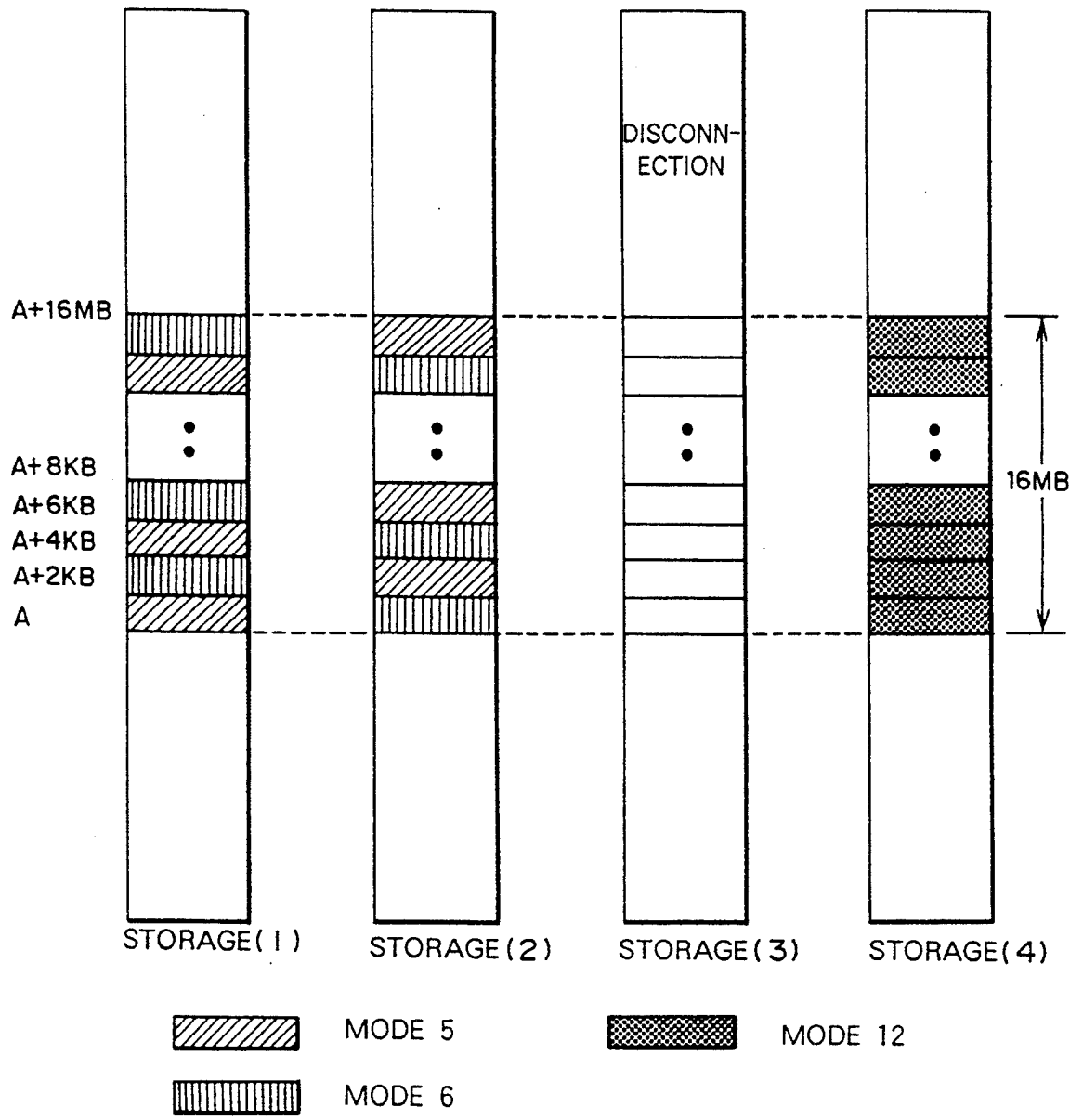
FIG. 9 is a diagram of the disconnection state of a storage equipment.

An embodiment of the above described disconnection processing will now be described by referring to FIG. 9.

In the state shown in FIG. 8a, four modes are mixedly present in storage equipments (1), (2), (3) and (4), and interleave is performed among four storage equipments (1), (2), (3) and (4). When the storage equipment (3) is to be disconnected from this state, the mode for performing interleave among four storage equipments (1), (2), (3) and (4) is replaced by a combination of two storage equipments (1) and (2) performing interleaving and a non-interleaved storage equipment (4). Assignment of the main storage equipment using all of the three storage equipments which should continuously work thus becomes possible.

As for the mode setting at this time, modes 5 and 6 are mixedly present in the storage equipments (1) and (2), whereas mode 12 is present in the storage equipment (4).

As a result of application of the above described method, assignment of the main storage equipment can be realized by using 32 kinds of modes in case of 8 storage equipments and by using 2n×(n×1) kinds of modes in typical case of 2n storage equipments.

Further, in case the effect of improvement of interleave by means of address saturates with an increase in the number of storage equipments, the following countermeasure may be taken. That is to say, the case where 16 FAR-addressed storage units are interleaved with 16 storage units is compared with the case where there are provided two sets, each comprising such a configuration the 8 FAR-addressed storage units are interleaved with 8 storage units. If there is not a large difference in effect of load distribution among storage units between the above described two cases, it is also possible to limit the number of storage equipments which become the subject of interleave to 8 to further reduce the number of modes.

The time period required for main storage re-configuration in the system of the present embodiment will now be evaluated. Although data transfer time from the main storage to another portion of main storage significantly differs depending upon the scale of the computer, it ranges from several hundreds MB per second to 1 GB per second for large systems. In performing main storage configuration processing described in an embodiment of the present invention, the locked state time of the main storage equipment becomes the time required for transfer of one FAR-addressed storage unit by repeating data transfer of the FAR-addressed storage unit located on the main storage equipment. Supposing that the time required for updating the FAR translation table 20 can be neglected, the transfer time becomes on the order of ten milliseconds on the basis of the above described transfer speed. During this time, the area on the main storage equipment requested to be in a locked state (suspended) in operation is only an area whereon transfer is being conducted. Other areas may be freely and continuously referred to or updated. In performing software processing, the above described suspension time seldom poses a problem.

Further, by making the capacity of the FAR translation table 20 large and defining a small value such as 1 MB as the FAR-addressed storage unit, the disable time of the main storage equipment can be reduced to several milliseconds.

As heretofore described, the present invention makes it possible to set an interleave mode for each FAR-addressed storage unit and hence facilitates realization of configuration control of main storage.

Further, it is possible to present degradation of response in a process control system, an online control system or the like requested to work in real-time operation.

Further, it is possible to shorten the period of data transfer processing of the entire main storage and shorten the period of suspension of the main storage.

Further, instead of setting one interleave mode with respect to the entire main storage area, it is possible to set respective different modes with respect to areas obtained by dividing the main storage into portions.

We claim:

1. In a computer system having a main storage including a plurality of storages capable of operating in parallel, a main storage addressing method comprising the steps of:

storing a plurality of interleave mode bits into a rewritable interleave field, said interleave bits being used to obtain a plurality of interleave modes;

performing address translation to translate a logical address used by a program functioning in a processor of the computer system to a physical address of a storage of the plurality of storages by using a translation table;

selecting one of the interleave modes in accordance with said logical address and the interleave bits;

in re-configuring the main storage by disconnecting one of the plurality of storages in accordance with said logical address on the basis of contents indicated by a predetermined bit contained in said logical address, performing processing of moving contents stored in a storage to be disconnected onto a storage not be disconnected;

storing in the translation table information reflecting a correspondence relation between logical addresses of contents stored in the storage to be disconnected and physical addresses;

rewriting said translation table so as not to change the logical address accessed from the program even upon a change in the physical address of the storage holding the storage contents therein; and changing the interleave mode corresponding to the logical address corresponding to said storage contents to reflect the changed physical address.

2. A main storage addressing method according to claim 1, wherein said step of moving the storage contents comprises the step of moving the storage contents which must be preserved, even after re-configuration, to an area whose contents need not be processed.

3. A main storage addressing method according to claim 2, wherein said interleave mode changing step comprises the step of changing the interleave mode so that interleave may be performed with those of the plurality of storages which are not disconnected.

4. A main storage addressing method according to claim 1, wherein said interleave mode changing step comprises the step of changing the interleave mode so that an interleave may be performed with those of the plurality of storages which are not disconnected.

5. A main storage addressing method in a computer system including, a plurality of storage equipments being capable of operating in parallel and forming a storage space having absolute addresses therein, a table containing at least a first information and a second information for each of entries respectively allotted to divided regions of said storage space, the first information indicating correspondences between absolute addresses in a corresponding divided region of said storage space and intra-storage-equipment addresses in said storage equipments, and the second information indicating at least whether the divided region of said storage space is interleavingly assigned to two or more of said storage equipments or continuously assigned to one of said storage equipments, and an address converting means for converting an absolute address into an intra-storage-equipment address according to the first information on said table, and for selecting one of said storage equipments in accordance with the second information on said table, the method comprising the steps of:

extracting regions to be maintained on said storage equipments out of divided regions of said storage space which is presently being used;

judging whether each of the extracted regions is at least partly assigned to one of said storage equipments which is to be disconnected from the computer system;

forming a void region by saving data of a region other than the extracted regions into an other of said storage equipments;

copying data in the each of the extracted regions, when it is at least partly assigned to one of said storage equipments to be disconnected, to the void region by designating absolute addresses of a source area in said storage space and by designating absolute addresses of a destination area in said storage space; and rewriting said table so that contents of an entry of said source area are changed to contents of an entry of said destination area.

6. A main storage addressing method according to claim 5, wherein said forming step includes forming said void region to be a divided region allotted to only one of said storage equipments which are not disconnected from said computer system.

7. A main storage addressing method according to claim 6, further comprising the step of setting another divided region which is alternately allocated to said storage equipments which will remain connected to said computer system as another void region.

8. The method according to claim 5 further comprising the steps of:

placing the source area into a locked state, whereby only processing equipment performing the copying step can gain access to the source area, and cancelling the locked state after the copying and rewriting steps.

* * * * *

UNITED STATES PATENT AND TRADEMARK OFFICE
CERTIFICATE OF CORRECTION

PATENT NO.   : 5,333,289
DATED        : July 26, 1994
INVENTOR(S)  : Seiji Kaneko, et al.

It is certified that error appears in the above-indentified patent and that said Letters Patent is hereby corrected as shown below:

Title Page:

The ciy of residence of the first inventor, Seiji Kaneko, should be Yokohama, Japan.

Claim 1, column 13, line 60, after "not" insert --to--.

Signed and Sealed this

Fourth Day of October, 1994

Attest:

BRUCE LEHMAN

*Attesting Officer*   Commissioner of Patents and Trademarks